United States Patent
Miao et al.

(10) Patent No.: US 7,633,992 B1
(45) Date of Patent: Dec. 15, 2009

(54) LASER MODULE INCLUDING JOINTLY ARRANGED ISOLATOR AND FIBER SLEEVE

(75) Inventors: Rongsheng Miao, El Monte, CA (US); Bryon L. Kasper, San Marino, CA (US); Genzao Zhang, Ottawa (CA)

(73) Assignee: Emcore Corporation, Albuquerque, NM (US)

( * ) Notice: Subject to any disclaimer, the term of this patent is extended or adjusted under 35 U.S.C. 154(b) by 0 days.

(21) Appl. No.: 12/250,284

(22) Filed: Oct. 13, 2008

(51) Int. Cl.
*H01S 3/08* (2006.01)

(52) U.S. Cl. .................. 372/703; 372/101; 372/108

(58) Field of Classification Search ............ 372/101, 372/108, 703
See application file for complete search history.

(56) References Cited

U.S. PATENT DOCUMENTS

| 6,404,042 B1 * | 6/2002 | Sone et al. ............... 257/678 |
| 6,697,414 B1 * | 2/2004 | Kato et al. ............... 372/102 |
| 2005/0123249 A1 * | 6/2005 | Yun et al. ............... 385/88 |
| 2009/0116838 A1 * | 5/2009 | Kihara ............... 398/79 |

* cited by examiner

*Primary Examiner*—Armando Rodriguez

(57) ABSTRACT

A laser module including a first housing which encloses a semiconductor laser device, a support, a fiber sleeve for holding an optical fiber, a lens, and an isolator. The isolator and the fiber sleeve are jointly arranged within a second housing which is an integral holder holding both the isolator and the fiber sleeve.

10 Claims, 3 Drawing Sheets

LASER MODULE INCLUDING JOINTLY ARRANGED ISOLATOR AND FIBER SLEEVE

FIELD OF THE INVENTION

The invention relates to electro-optical converters and more particularly to semiconductor laser packages or modules including an optical fiber and a semiconductor laser device, such as a semiconductor diode, optically coupled to said optical fiber.

BACKGROUND INFORMATION

Semiconductor lasers are used in many different applications, such as in optical fiber communications, where they can be used at the interface between the electronic signal processing circuitry and the optical transmission lines. The semiconductor laser device generates light that is transmitted through the optical fiber. For this purpose, a semiconductor laser package or module includes the semiconductor laser device and a portion of the optical fiber, as well as other optical components, including at least one lens and at least one isolator. These components are held at fixed positions within the module so as to assure that the light generated by the laser device is effectively coupled into the optical fiber at an end of the optical fiber. The process of aligning an optical fiber to a laser device and fixing it in place is sometimes referred to as fiber pigtailing. Currently in the industry, there are two types of form factors for laser packages or modules. One is the coaxial or TO (transistor outline) package and the other is the flat pack. The flat pack form factor package includes arrangements such as butterfly packages, mini-tail packages, mini-dil packages, etc.).

Flat form factor laser modules basically comprise a set of components, including a semiconductor laser device, a lens, and isolator and a fiber sleeve holding an optical fiber. These components can be mounted on some kind of support or optical bench which is housed inside a box-like hermetically sealed housing, and the laser device (such as the laser diode) and its related circuitry, sometimes referred to as a laser block, are electrically connected to one or more pins, which can extend laterally from the housing (such as in the so-called butterfly laser modules).

FIG. 1 shows one possible configuration of some of the above-mentioned elements: a laser block 11 (including a semiconductor laser device 1 such as a laser diode, having a light-emitting surface or end), an optical lens 2 arranged in a lens holder 21, an isolator 3A arranged in an isolator holder 3B, and an optical fiber sleeve 4 (also known in the art as a ferrule, basically made up of a rigid tube) arranged in a sleeve holder 4A, are all arranged on an L-shaped support. The lens 2 is arranged for focusing the light emitted by the laser device onto an end of an optical fiber (not shown in FIG. 1) and the isolator is arranged to prevent light from being reflected back towards the laser device from the optical fiber end and the surrounding parts of the assembly. Suitable lenses, isolators and fiber sleeves (or ferrules) are well known in the art and there is no need to further describe these elements here.

In the semiconductor laser module, the assembly illustrated in FIG. 1 can be placed on a cooling device, such as a thermo-electric cooler (TEC) or Peltier effect element, which can be used to control the temperature of the laser device the permit higher performance and/or operation over a greater power range.

SUMMARY OF THE INVENTION

It has been considered that an arrangement as per FIG. 1, although it may work efficiently in what regards its optical features and thus provide effective coupling of the light generated by the laser device into the optical fiber, may however not be optimal from a cost, thermal load and size perspective. Thus, an objective of the invention is to provide a further improved laser module.

One aspect of the invention is a laser module comprising:
 a first housing, said first housing being a hermetically sealed module housing;
 a semiconductor laser device (such as a laser diode) arranged within said first housing (for example, on a laser block arranged within the housing);
 a plurality of pins extending from said first housing (for example, laterally in a "butterfly" manner, or in any other suitable manner), at least some of said pins being arranged for connecting the laser device to electronic circuitry external to said first housing; and
 a support arranged within said first housing, said semiconductor laser device being arranged on said support.

The laser module further comprises:
 a fiber sleeve for holding an optical fiber, said fiber sleeve being arranged on said support for supporting said optical fiber in a fixed relation to the laser device, for allowing light from the laser device to enter said optical fiber (for example, the fiber sleeve can be of the type often referred to in the art as a "ferrule"; the fiber sleeve typically is a zircornia capillary);
 a lens arranged on said support for focusing light from the laser device onto an end of said optical fiber; and
 an isolator for preventing light from being reflected back towards the laser device.

Said isolator and the fiber sleeve are jointly arranged within a second housing, said second housing being an integral holder, holding both said isolator and said fiber sleeve.

By arranging the fiber sleeve and isolator jointly in said second housing a relatively short support (such as a relatively short L-shaped support) can be used, whereby the total surface areas on top of the support can be reduced significantly, which in turn can significantly reduce the passive thermal load caused by radiation and convection during operation of the laser package, as these two forms of heat transfer are directly related to the surface areas where heat transfer occurs. Thus, a smaller cooling element can be used, which can help to reduce the costs of the device, and also its size.

Also, using this arrangement, there is no need for a separate isolator holder, and the isolator can be placed very close to the end of the fiber, which further allows a comparatively small isolator to be used, which can help to further reduce the costs involved and/or the size of the entire module. Also, the overall design can facilitate the manufacturing of the module.

The second housing can be a tubular housing comprising a first portion with a first inner diameter arranged to house the isolator, and a second portion with a second inner diameter arranged to house the fiber sleeve, the first inner diameter and the second inner diameter being different (for example, the first inner diameter can be larger than the second inner diameter). This feature can, for example, help to facilitate mounting of the isolator in the housing.

The isolator can be placed in said second housing abutting against a seat in said second housing. This feature can be help to further facilitate assembly of the isolator in the housing.

The isolator can be bonded into the second housing by epoxy. This feature can further help to facilitate the assembly process and also to reduce the risk for misalignments that can occur when laser welding is used.

A through hole can provided in a wall of said second housing for allowing inspection of a space between said isolator and an end of the fiber sleeve, for facilitating positioning and alignment of the optical fiber. This also helps to facilitate the assembly process.

The support can be an L-shaped support comprising a first portion and a second portion extending substantially perpendicularly to said first portion. The laser device and the lens can be arranged on said first portion, and the second housing, housing said isolator and fiber sleeve, can be arranged on the second portion. For example, the laser device and the lens can be placed on a surface of said first portion, and said second housing can be arranged on said second portion in correspondence with a through hole of said second portion which allows light from the laser device to pass through said second portion.

By the arrangement of isolator and fiber sleeve in a common housing, the optical conjugate distance, i.e., the distance between the laser emitting surface to the end of said optical fiber, can be kept the same, which will not induce any changes in optical characteristics.

The support can placed on a cooling device (such as a thermo-electric cooler—"TEC"—or Peltier effect element) for allowing temperature control of the laser device. Thanks to the arrangement of fiber sleeve and isolator in a common housing, a smaller cooling device can be used than those that have been used in some prior art laser modules.

The second housing can be a metal housing and/or can be provided with fiduciary markers or other features for ease of assembly optical purposes.

The laser module can be a butterfly module, but it can also be another kind of laser module, such as another kind of flat form factor laser module.

Additional advantages and features will become apparent to those skilled in the art from this disclosure, including the following detailed description. While the invention is described below with reference to implementations thereof, the invention is not limited to those implementations. Those of ordinary skill in the art having access to the teachings herein will recognize additional applications, modifications and implementations, which are within the scope of the invention as disclosed and claimed herein and with respect to which the invention could be of utility.

BRIEF DESCRIPTION OF THE DRAWINGS

The fact that two items are referred to by the same reference numeral does not imply that they are necessarily identical. Identical reference numbers can also be used for similar or corresponding elements, in order to facilitate comprehension of the drawings.

DESCRIPTION OF AN EMBODIMENT OF THE INVENTION

Figure 1:
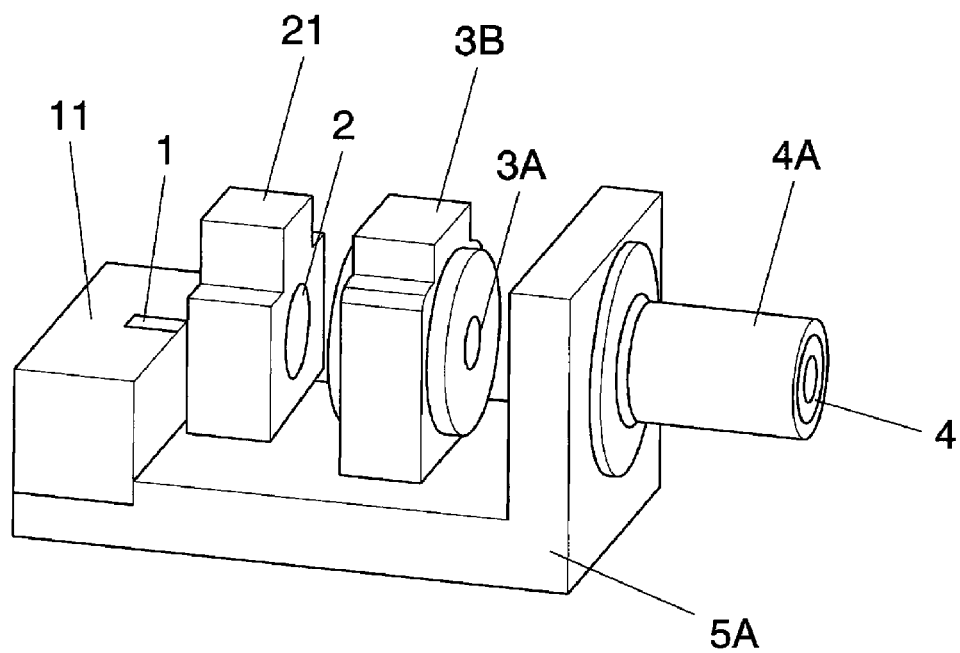
FIG. 1 illustrates a non-claimed arrangement in which the isolator and the fiber sleeve are not jointly arranged within a second housing.
Figure 2:
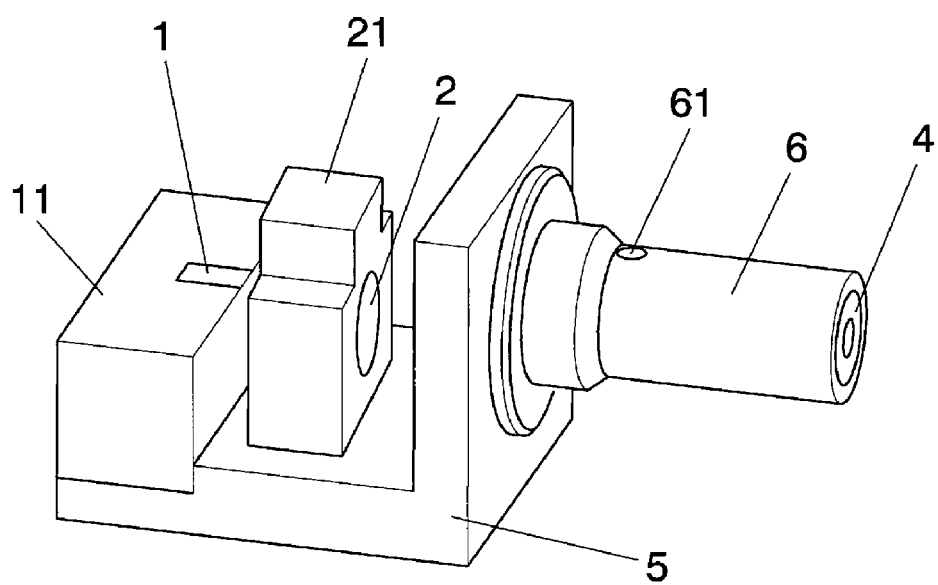
FIGS. 2 and 3 illustrate some of the elements of a laser module in accordance with one possible embodiment of the invention.

FIG. 2 shows one possible embodiment of the invention, including a laser block 11 including a semiconductor laser device 1—such as a laser diode—having a light-emitting surface or end, and an optical lens 2 arranged in a lens holder 21. The laser block 11 and the lens 2 are both arranged on a first portion of an L-shaped support 5. However, contrarily to what is illustrated in FIG. 1, in the embodiment of FIG. 2 there is no separate isolator holder arranged on the support. Instead, a second housing 6 is provided, in which both the isolator (not shown in FIG. 2) and the fiber sleeve 4 are arranged.

The laser block 11 and the lens 2 are both placed on a first arm of the L-shaped support 5. The second arm, which extends perpendicularly to said first arm, includes a through hole, and the second housing 6 is placed in correspondence with said through hole.

Figure 3:
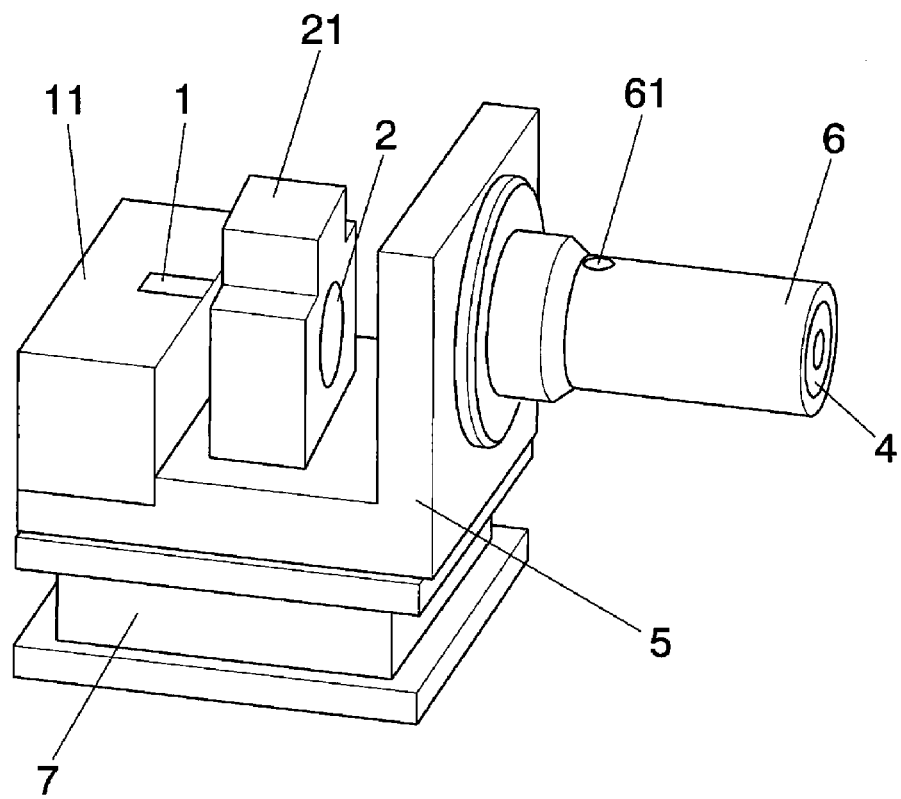

FIG. 3 shows the assembly of FIG. 2 placed on a cooling element 7, such as a thermo-electric cooler.

If compared to FIG. 1, it is clear from FIGS. 2 and 3 that the support can be made shorter. The shorter support makes it possible to use a shorter cooling element 7.

Figure 4:
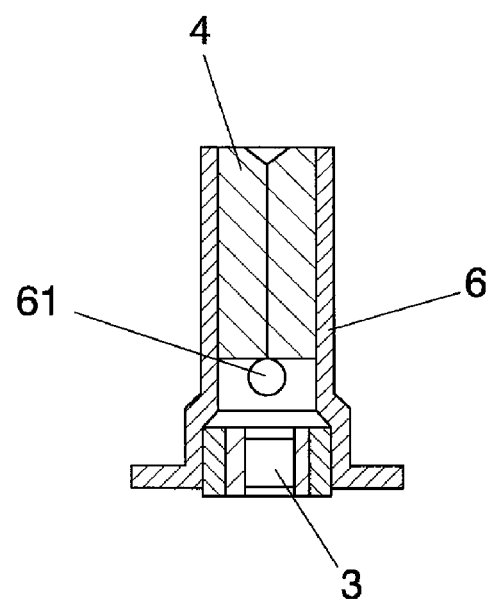
FIG. 4 schematically illustrates a longitudinal cross section of the second housing.

FIG. 4 illustrates how the isolator 3 and the fiber sleeve 4 are housed in said common housing 6. The housing has a first portion with a first inner diameter arranged to house the isolator 3, and a second portion with a second inner diameter, smaller than said first inner diameter, arranged to house the fiber sleeve 4. The isolator 3 is abutting against a seat formed at the transition between the first inner diameter and the second inner diameter and is epoxy bonded to the housing 6. A through hole 61 is provided which makes it possible to inspect, from the outside, the end of the fiber sleeve and the space between fiber sleeve and isolator. This makes it possible to observe, from the outside, the exact position of the end of the optical fiber (not shown in FIG. 4), and thus to control the correct position and alignment thereof.

Figure 5:
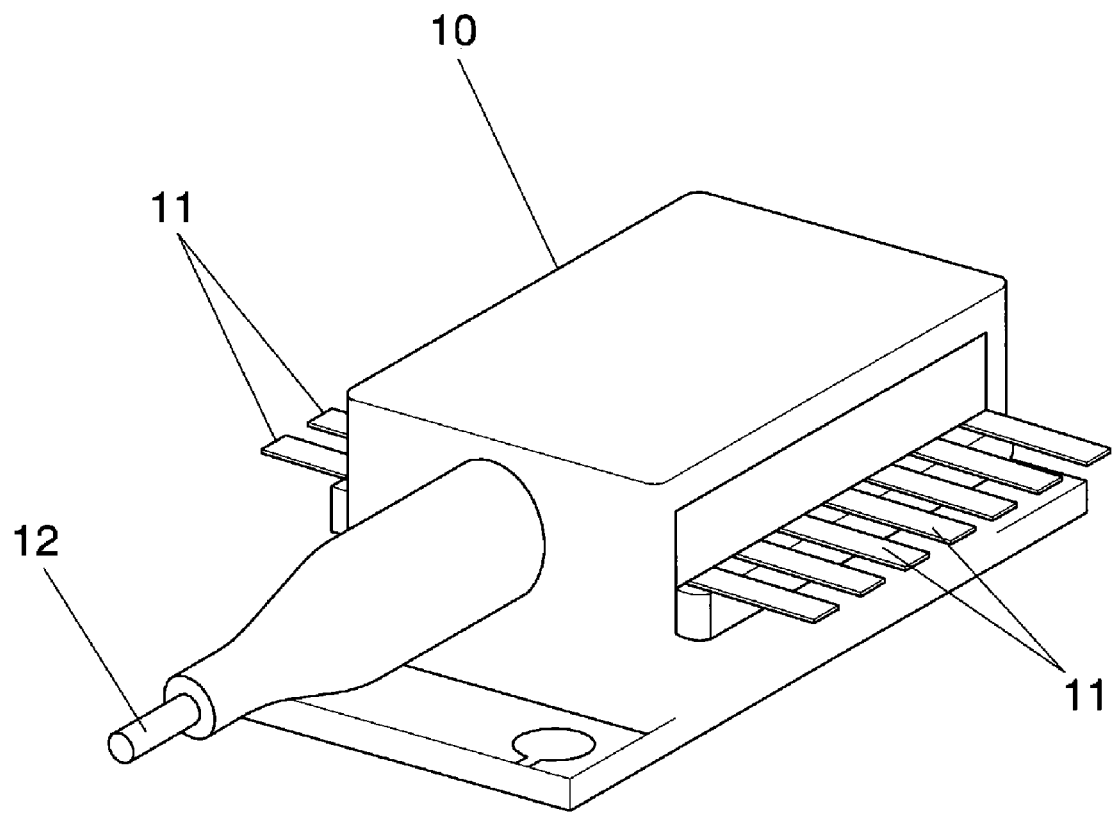
FIG. 5 is a general view of a laser module.

FIG. 5 schematically illustrates a butterfly laser module, with a first housing 10 which houses an arrangement as illustrated in FIG. 3, and from which a plurality of electrodes 11 extend laterally. An optical fiber 12 extend into said laser module, where it is held in position by the fiber sleeve.

In this text, the term "comprises" and its derivations (such as "comprising", etc.) should not be understood in an excluding sense, that is, these terms should not be interpreted as excluding the possibility that what is described and defined may include further elements, steps, etc.

The invention claimed is:

1. Laser module comprising:
    a first housing, said first housing being a hermetically sealed module housing;
    a semiconductor laser device arranged within said first housing;
    a plurality of pins extending from said first housing, at least some of said pins being arranged for connecting the laser device to electronic circuitry external to said first housing;
    a support arranged within said first housing, said semiconductor laser device being arranged on said support;
    the laser module further comprising
        a fiber sleeve for holding an optical fiber, said fiber sleeve being arranged on said support for supporting said optical fiber in a fixed relation to the laser device, for allowing light from the laser device to enter said optical fiber;

a lens arranged on said support for focusing light from the laser device onto an end of said optical fiber;

an isolator for preventing light from being reflected back towards the laser device;

wherein said isolator and the fiber sleeve are jointly arranged within a second housing, said second housing being an integral holder holding both said isolator and fiber sleeve.

2. Laser module according to claim 1, wherein said second housing is a tubular housing comprising a first portion with a first inner diameter arranged to house the isolator, and a second portion with a second inner diameter arranged to house the fiber sleeve, the first inner diameter and the second inner diameter being different.

3. Laser module according to claim 2, wherein the isolator is placed in said second housing abutting against a seat in said second housing.

4. Laser module according to claim 1, wherein said isolator is bonded into the second housing by epoxy.

5. Laser module according to claim 1, wherein a through hole is provided in a wall of said second housing for allowing inspection of a space between said isolator and an end of the fiber sleeve, for facilitating positioning of the optical fiber.

6. Laser module according to claim 1, wherein the support is an L-shaped support comprising a first portion and a second portion extending substantially perpendicularly to said first portion, said laser device and said lens being arranged on said first portion, and said second housing, housing said isolator and said fiber sleeve, being arranged on said second portion.

7. Laser module according to claim 6, wherein said laser device and said lens are placed on a surface of said first portion, and wherein said second housing is arranged on said second portion in correspondence with a through hole of said second portion allowing light from the laser device to pass through said second portion.

8. Laser module according to claim 1, wherein said support is placed on a cooling device for allowing temperature control of the laser device.

9. Laser module according to claim 1, wherein said second housing is a metal housing.

10. Laser module according to claim 1, said laser module being a butterfly module.

* * * * *